(12) United States Patent
Templ

(10) Patent No.: US 8,373,242 B2
(45) Date of Patent: Feb. 12, 2013

(54) PHOTONIC POWER SWITCH AND METHOD OF CONTROLLING CURRENT FLOW IN THE PHOTONIC POWER SWITCH AND USE OF SUCH PHOTONIC POWER SWITCH

(75) Inventor: Wolfgang Templ, Sersheim (DE)

(73) Assignee: Alcatel Lucent, Paris (FR)

( * ) Notice: Subject to any disclaimer, the term of this patent is extended or adjusted under 35 U.S.C. 154(b) by 391 days.

(21) Appl. No.: 12/461,841

(22) Filed: Aug. 26, 2009

(65) Prior Publication Data
US 2010/0065937 A1 Mar. 18, 2010

(30) Foreign Application Priority Data
Sep. 18, 2008 (EP) .................................... 08305566

(51) Int. Cl.
*H01L 33/00* (2010.01)
(52) U.S. Cl. ........................................ 257/438; 438/129
(58) Field of Classification Search .................... 437/129; 257/438, E31.063; 148/DIG. 53
See application file for complete search history.

(56) References Cited

U.S. PATENT DOCUMENTS

| | | | |
|---|---|---|---|
| 5,021,361 A * | 6/1991 | Kinoshita et al. | 438/23 |
| 6,969,896 B1 * | 11/2005 | Partain et al. | 257/428 |
| 6,987,306 B2 * | 1/2006 | Fathimulla et al. | 257/431 |
| 2003/0047752 A1 | 3/2003 | Campbell et al. | |
| 2004/0251483 A1 | 12/2004 | Ko et al. | |
| 2007/0221827 A1 | 9/2007 | Fathimulla et al. | |
| 2010/0065937 A1 * | 3/2010 | Templ | 257/438 |

FOREIGN PATENT DOCUMENTS

EP 0757392 2/1997

OTHER PUBLICATIONS

Sedra et al. "Fifth edition Microelectronic circuits" New York Oxford University Press p. 249 2004.*
European Search Report, Mar. 4, 2009.

* cited by examiner

*Primary Examiner* — Michael Shingleton
(74) *Attorney, Agent, or Firm* — Harness, Dickey & Pierce

(57) ABSTRACT

Photonic power switch and method of controlling current flow in the photonic power switch, the photonic power switch comprising an avalanche photo diode installed on a switch element, the switch element comprising a carrier donor layer and a channel layer. Photons are injected in the avalanche photo diode for generating electrical charge carriers by photoeffect, and the generated charge carriers are accelerated the by an electric field so as to produce an avalanche effect and are injected from the avalanche photo diode into the carrier donor layer of the switch element. A conduction layer built between the donor layer and the channel layer of the switch element is modulated, thereby modulating a current flow between a drain and a source of the power switch through said conduction layer.

6 Claims, 1 Drawing Sheet

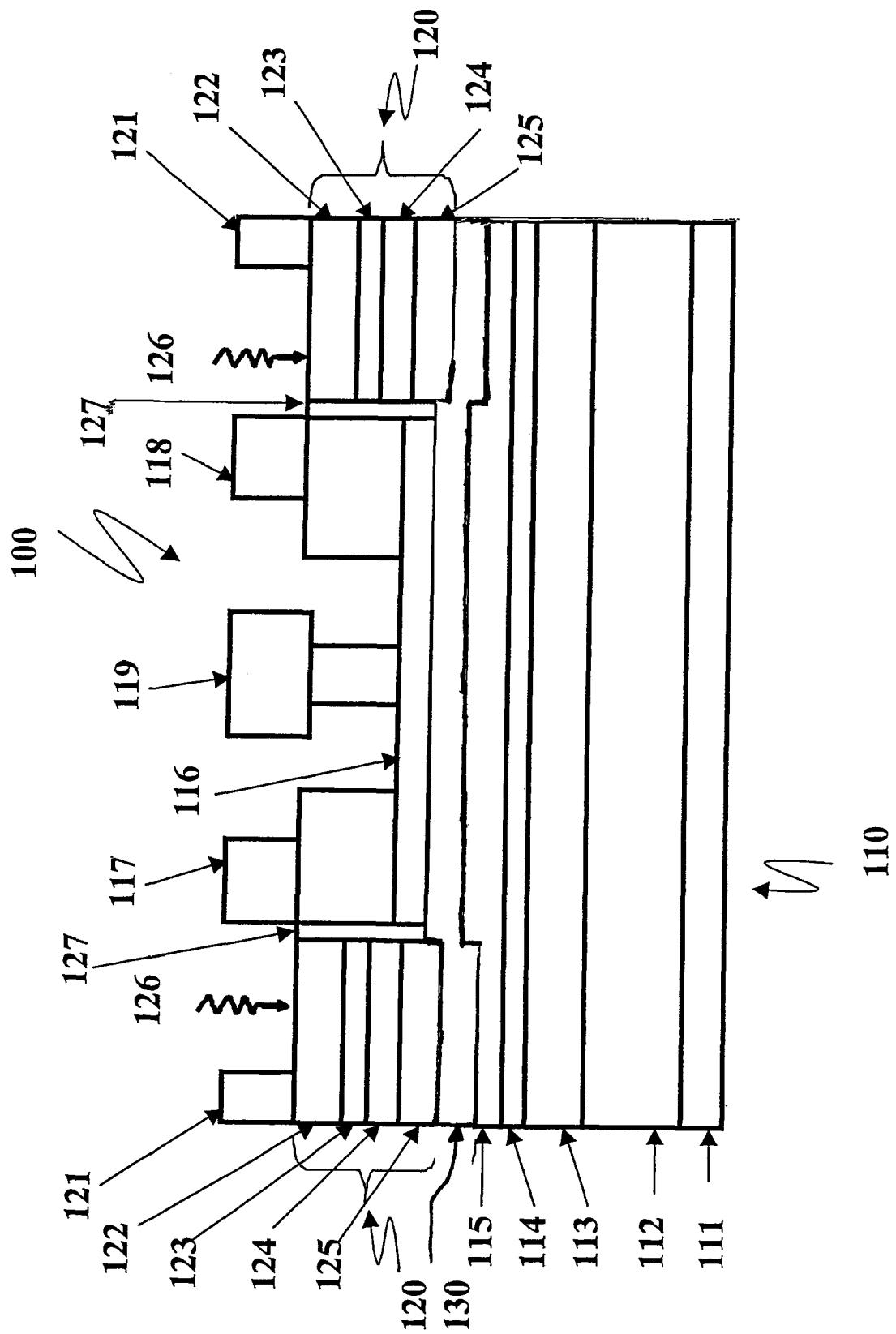

PHOTONIC POWER SWITCH AND METHOD OF CONTROLLING CURRENT FLOW IN THE PHOTONIC POWER SWITCH AND USE OF SUCH PHOTONIC POWER SWITCH

CROSS-REFERENCE TO RELATED APPLICATIONS

The present application claims priority to and incorporates by reference the entire contents of European Patent Application No. 08305566.5 filed on Sep. 18, 2008.

BACKGROUND OF THE INVENTION

The present invention relates to photonic devices. In particular, the invention relates to photonic devices which may be used for any optically controlled, and preferably fast, switch.

Photonic devices for use as optically controlled, and preferably fast, switches may have a variety of applications.

In order to ensure a reliable transmission, there is a need for sufficient power, and as consequence an efficient power amplifier. Some known solutions propose the use of new electronic circuit concepts such as envelope tracking amplifiers or switched (Class-S) amplifiers in order to increase power amplifier efficiency. However, most of the known solutions require the use of various devices such as optical/electrical converters, pre-amplifiers and the like. These solutions therefore involve a high device count resulting in additional cost, efficiency loss due to device matching circuits and wiring, as well as a decrease in system reliability.

DESCRIPTION OF THE INVENTION

Embodiments of the present invention aim at providing an optically triggered power switch comprising an avalanche photo diode and a low loss switch element.

According to some embodiments, there is provided a photonic power switch comprising an avalanche photo diode (APD) installed on a switch element, the switch element comprising a carrier donor layer and a channel layer, wherein the APD is disposed on the switch element such that accelerated charge carriers generated by photoeffect in an absorption region and output from the APD are input into a conduction layer generated between the carrier donor layer and the channel layer.

According to some embodiments, there is provided a method of controlling current flow in a photonic power switch, the photonic power switch comprising an avalanche photo diode installed on a switch element, the switch element comprising a carrier donor layer and a channel layer, the method comprising the steps of injecting photons in the APD for generating electrical charge carriers by photoeffect, accelerating the generated charge carriers by an electric field so as to produce an avalanche effect, injecting the accelerated charge carriers from the APD into the carrier donor layer of the switch element and modulating a conduction layer built between the donor layer and the channel layer of the switch element, thereby modulating a current flow between a drain and a source of the power switch through said conduction layer.

One particular use of the power switch of the invention is in radio frequency applications, for example in Radio over Fiber applications, however other applications related to any optically controlled, and preferably fast, switch are also possible.

These and further features and advantages of the present invention are described in more detail in the following description as well as in the claims with the aid of the accompanying drawing.

BRIEF DESCRIPTION OF THE DRAWING

FIG. 1 is an exemplary schematic cross-section representation of an optically triggered power switch according to embodiments of the invention.

EXAMPLES OF PREFERRED EMBODIMENTS

In the embodiments of the present invention a HEMT (High Electron Mobility Transistor) is used as a switch element, which in terms of basic structure is a known device. However, a brief description of a typical HEMT is herein provided in order to facilitate a better understanding of the embodiments of the invention. HEMT has a structure based on a field effect transistor where two materials with different band gaps are separated from each other by means of a layer usually called a junction. A first material may be for example AlGaN, or AlGaAs and a second material may be GaN or GaAs. Other materials may also be used depending on the type of application involved.

The first material, for example AlGaN, may be typically a highly-doped n-type layer, typically with a wide band gap, the layer being typically called supply, or donor, layer. The second material, for example GaN, may be typically an un-doped layer, typically with a narrow band gap, the layer being typically called channel layer. A junction is formed between the two layers containing high mobility electrons, the high mobility electrons being capable of allowing conduction through the junction, and thus through the device. The advantage of this type of devices is that they are capable of conducting levels of current which are significantly higher as compared to conventional FETs due to the absence of charge scattering by doping impurities and the relatively high electron mobility together with a superior carrier transport properties of the two dimensional electron gas created in the junction between the two layers. Therefore, they are useful in power applications. The conductivity of the carrier transport layer, and consequently the conductivity between source and drain terminals of the device is adjusted in the conventional devices by an adjustable voltage applied to the gate of the device.

For the sake of clarity it is to be noted that the two dimensional electron gas (2DEG) is a known concept in the related art generally referring to a "gas" of electrons which are free to move in a two dimensions, the third dimension of the space used for the free movement being very narrow, and thus neglected for practical purposes.

According to embodiments of the present invention, an avalanche photo diode structure (APD) is integrated with a HEMT structure. The APD is capable of causing acceleration of photon triggered carriers in a high electrical field thus giving rise to multiplication of the carriers by avalanche effect. The effect of an APD integrated with a HEMT structure may cause the accelerated carriers to influence the potential of the carrier supply layer, hence modulating the two dimensional electron gas (2DEG) of the HEMT inside a depletion layer. This manner of modulating the 2DEG is different from the known solutions where the gate electrode is used to control the response of a conventional HEMT.

In addition, charge multiplication and/or acceleration in the APD may be drawn from the high electrical internal field usually being present during the operation of a GaN-based radio frequency power HEMT. Although this possibility is not mandatory, it is an additional advantage of the proposed structure because it helps to avoid a dedicated voltage supply for the APD by taking advantage of the already available high HEMT supply voltage.

FIG. 1 shows a schematic representation of an optically triggered power switch according to embodiments of the invention. The power switch 100 comprises an HEMT 110 and an APD 120.

The HEMT 110 comprises a substrate 111 for example of silicon carbide material, a barrier or buffer layer 112 for example of GaN, a channel layer 113 for example of GaN which is preferably undoped, the buffer layer 112 and the channel layer 113 together having a thickness for example between 2000 nm and 3000 nm, a spacer layer 114 which may contain a conduction layer for example of AlGaN and preferably undoped having a thickness of for example 5 nm, an AlGaN donor (or supply) layer 115 preferably being highly doped with n-type charge and having a wide band-gap with a thickness of for example 25 nm n, a barrier layer 116 for example of AlGaN having a thickness of for example 3 nm, a source terminal 117, a drain terminal 118 and a gate terminal 119. The layers described above may be constructed using known methods such as for example expitaxial growth techniques which are known to a person skilled in the art. The above described structure is to be considered as exemplary as regards layers as well as materials used. Those skilled in the related art will realize that other structures and materials may also be used in the construction of the HEMT.

The APD 120 as shown in the FIGURE is represented in two parts, each part at one side of the FIGURE. However, it is to be noted that the two parts conform one APD as is described below. In practice, the APD may form a circular or rectangular ring around the gate electrode of the HEMT. However, these constructions are not mandatory and it may also be envisaged that the APD is placed at the center of the overall structure in case geometrical charge and field distribution within the device are of concern.

The APD 120 may comprise an intrinsic photon absorption layer 124 for example of InAlN and a thickness of a few hundreds of nm, covered by a positive (p-type) doped multiplication region 125 for example of InN and a thickness of approximately 200 nm, both sandwiched by a positive doped 125 and negative doped 122 InN-layer which in use are reversely biased. The APD also comprises contact electrodes 121. The layers described above may be constructed using known methods such as expitaxial growth techniques which are known to a person skilled in the art. The above described structure is to be considered as exemplary as regards layers as well as materials used. Those skilled in the related art will realize that other structures and materials may also be used in the construction of the APD.

Isolation layer 127 isolates the APD structure 120 from parts of HEMT 110 where contact is to be avoided, for example with the source 117, drain 118 and the barrier layer 116.

As it is known, the APD is a current generating device, namely it generates an output current which is proportional to the optical input power. The HEMT however is an electrostatic device, hence it is controlled by electrical potential. Therefore in a practical implementation, there may arise a need for an impedance transforming element between the APD and the HEMT. This function in a conventional setup may be performed by a trans-impedance amplifier.

In the case of the present invention, the APD and the HEMT may be constructed such that a resistive layer 130 is capable of acting as a resistive element. This can be supported by a dedicated lateral doping profile in this layer.

As it is known, by applying a relatively high reverse bias voltage, for example in the order of several tens of volts, an internal current gain effect is produced in the APD due to the so-called avalanche effect.

In the embodiments of the present invention, bias voltage is applied to electrodes 121, and light is injected in the APD as schematically shown in the FIGURE by reference numeral 126. Therefore, the photons injected in the APD generate charge carriers which are accelerated in a high electrical field caused by the bias voltage applied to electrode 121 and which are subsequently multiplied according to avalanche effect. The accelerated and multiplied carriers travel from the APD into the carrier donor layer 115 of the HEMT 110 and as a consequence influence the electrical potential of the carrier donor layer 115 by modulating the density of free charge carriers, hence modulating the two dimensional electron gas (2DEG) which is built in a conduction layer between the donor layer 115 and the channel 113 of the HEMT. In this manner, by optical excitation of the APD, the HEMT current throughput between source 117 and drain 118 terminals may be controlled and adjusted, thus controlling the power output of the device 100.

In fact, what is modulated in the present case is the electrical potential by modulation of charge carrier concentration. This approach distinguishes from the conventional approach of electrical control of the HEMT which is based on applying a voltage to the gate electrode. However, the still available gate electrode may be used for additional electrical modulation or for biasing.

In addition, advantage is taken from the high electrical internal field which is usually present in the HEMT in order to enhance, as much as possible, the charge multiplication and/or acceleration in the avalanche diode.

One particular use of the power switch of the invention is in radio frequency applications, for example in Radio over Fiber applications, however other applications related to any optically controlled, and preferably fast, switch are also possible.

As regards advantages of the embodiments of the invention mention may be made to allowing for substantial reduction of device count (i.e. the number of elements used) for manufacturing photonic switched power amplifier concepts, such as for example in RF applications, thus improving efficiency and hardware usage for RF-power amplifiers in a BTS. Additionally the solution proposed herein helps to reduce susceptibility to failure due to integration of optical/electrical conversion, inherent signal mixing (by optical heterodyning) and final stage of switched RF-amplifier.

Other advantages are improving power efficiency, improving overall system reliability, reducing susceptibility to noise interference.

The invention claimed is:
1. An optically triggered photonic power switch comprising:
a switch element; and
an avalanche photo diode disposed on the switch element, wherein
the switch element is a high electron mobility transistor (HEMT) and includes a carrier donor layer and a channel layer,
the avalanche photo diode includes an absorption layer, the absorption layer being configured to generate by photoeffect, accelerated charge carriers, and
the switch element is configured to generate a conduction layer between the carrier donor layer and the channel layer, that contains a two dimensional electron gas (2DEG) that is modulated in response to inputting said accelerated charge carriers into said conduction layer to trigger the switch.

2. The photonic power switch of claim 1, wherein at least one layer between the avalanche photo diode and the switch element is a resistive element.

3. A method of controlling current flow in a photonic power switch, the photonic power switch comprising an avalanche photo diode installed on a high electron mobility transistor (HEMT) acting as a switch element, the switch element comprising a carrier donor layer and a channel layer, the method comprising injecting photons in the avalanche photo diode for generating electrical charge carriers by photoeffect, accelerating the generated charge carriers by an electric field so as to produce an avalanche effect, injecting the accelerated charge carriers from the avalanche photo diode into the carrier donor layer of the switch element, and modulating a two-dimensional electron gas (2DEG) in a conduction layer built between the donor layer and the channel layer of the switch element in response to the injecting of the accelerated charge carriers, thereby modulating a current flow between a drain and a source of the power switch through said conduction layer.

4. The method of claim 3 further comprising the step of providing an impendence by means of a resistive element present in at least one layer between the avalanche photo diode and the switch element.

5. Use of the photonic power switch of claim 1 in radio frequency applications.

6. Use according to claim 5 wherein such use is in radio over fiber.

* * * * *